(12) United States Patent
Jain

(10) Patent No.: US 6,510,075 B2
(45) Date of Patent: Jan. 21, 2003

(54) MEMORY CELL WITH INCREASED CAPACITANCE

(76) Inventor: Raj Kumar Jain, 66 Bayshore Road, Unit 06-06, Diamond Tower (SG), 469985

(*) Notice: Subject to any disclaimer, the term of this patent is extended or adjusted under 35 U.S.C. 154(b) by 0 days.

(21) Appl. No.: 09/855,166

(22) Filed: May 14, 2001

(65) Prior Publication Data

US 2002/0167837 A1 Nov. 14, 2002

Related U.S. Application Data

(63) Continuation-in-part of application No. 09/806,299, filed on Oct. 3, 2001, and a continuation-in-part of application No. 09/806,395, filed on Dec. 6, 2001, and a continuation-in-part of application No. 09/615,987, filed on Jul. 14, 2000, now Pat. No. 6,304,478.

(51) Int. Cl.$^7$ ............................................. G11C 11/40
(52) U.S. Cl. .................................. 365/154; 365/230.05
(58) Field of Search ........................... 365/154, 230.05, 365/155, 156

(56) References Cited

U.S. PATENT DOCUMENTS

| | | | | |
|---|---|---|---|---|
| 5,717,638 A | * | 2/1998 | Kim | 365/230.05 |
| 5,757,694 A | * | 5/1998 | Mitani | 365/154 |
| 5,761,113 A | * | 6/1998 | Natsume et al. | 365/154 |
| 5,812,476 A | * | 9/1998 | Segawa | 365/230.05 |

* cited by examiner

*Primary Examiner*—Tan T. Nguyen
(74) *Attorney, Agent, or Firm*—Dexter Chin

(57) ABSTRACT

A memory cell having first and second access transistors coupled to a storage transistor is disclosed. The storage transistor comprises a gate oxide formed from a material having a high dielectric constant to increase the capacitance.

12 Claims, 7 Drawing Sheets

MEMORY CELL WITH INCREASED CAPACITANCE

This is a continuation-in-part of patent applications, titled: "Dual-Port Memory Cell", U.S. Ser. No. 09/806,299, filing date Oct. 3, 2001, "Single-Port Memory Cell", U.S. Ser. No. 09/806,395, filing date Dec. 6, 2001, and "Layout for a SemiConductor Memory", U.S. Ser. No. 09/615,987, filing date Jul. 14, 2000 now U.S. Pat. No. 6,304,478.

FIELD OF THE INVENTION

The present invention relates generally to memory cells. More particularly, the invention relates to memory cells having improved retention time.

BACKGROUND OF THE INVENTION

Integrated circuits (ICs) such as digital signal processors (DSPs) include on-chip memory to store information. The on-chip memory typically comprises, for example, an array of static random access memory (SRAM) cells connected by word lines in one direction and bit lines in another direction. The information stored in the SRAM cells are maintained until power is removed from the IC. Sense amplifiers are coupled to the bit lines to facilitate memory accesses, such as reads or writes. A sense amplifier is coupled to a pair of bit lines and senses a differential voltage indicative of the information stored in the selected memory cell on the bit line pair.

FIG. 1 shows a conventional SRAM cell 101. The SRAM cell comprises first and second transistors 110 and 120 coupled to a latch 130, which stores a bit of information. One transistor is coupled to a bit line 140 and the other is coupled to a bit line complement 141 while the gates are coupled to a word line 135. The latch includes first and second inverters 133 and 134, each implemented with two transistors. As such, the SRAM cell is realized using six transistors.

Smaller SRAM cells using less than six transistors have been proposed to reduce chip size. However, the charge stored in such cells dissipates overtime. In order to restore the information stored in the cell, a refresh operation is required. Typically, refreshing of memory cells interrupts the normal operation, adversely impacting performance.

As evidenced from the above discussion, it is desirable to provide a memory cell with improved retention time.

SUMMARY OF THE INVENTION

The present invention relates to memory cells. More particularly, the invention relates to increasing the capacitance of memory cells to improve retention time. The memory cell, in accordance with one embodiment of the invention, comprises first and second access transistors coupled to respective first and second terminals of a storage transistor. The gate oxide of the storage transistor comprises a material having a high dielectric constant. The use of a high dielectric constant material as the gate oxide increases the capacitance of the storage capacitor.

PREFERRED EMBODIMENTS OF THE INVENTION

Figure 1:
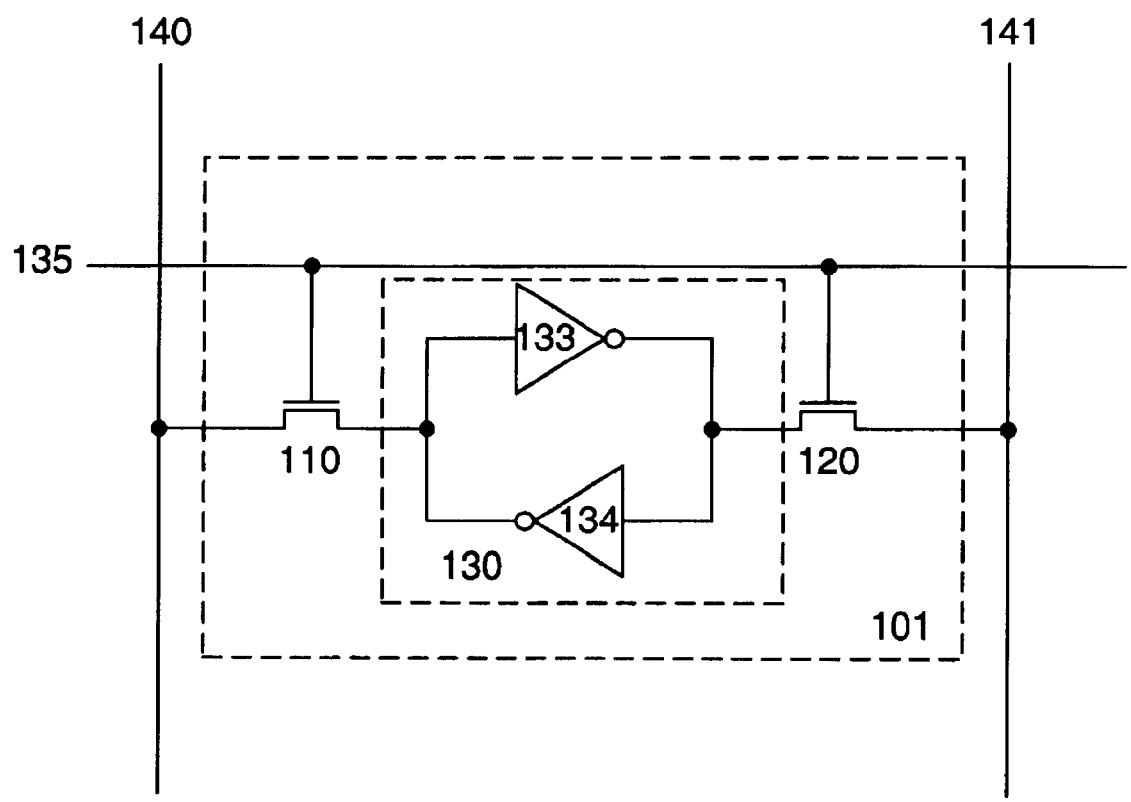
FIG. 1 shows a conventional SRAM cell.
Figure 2:
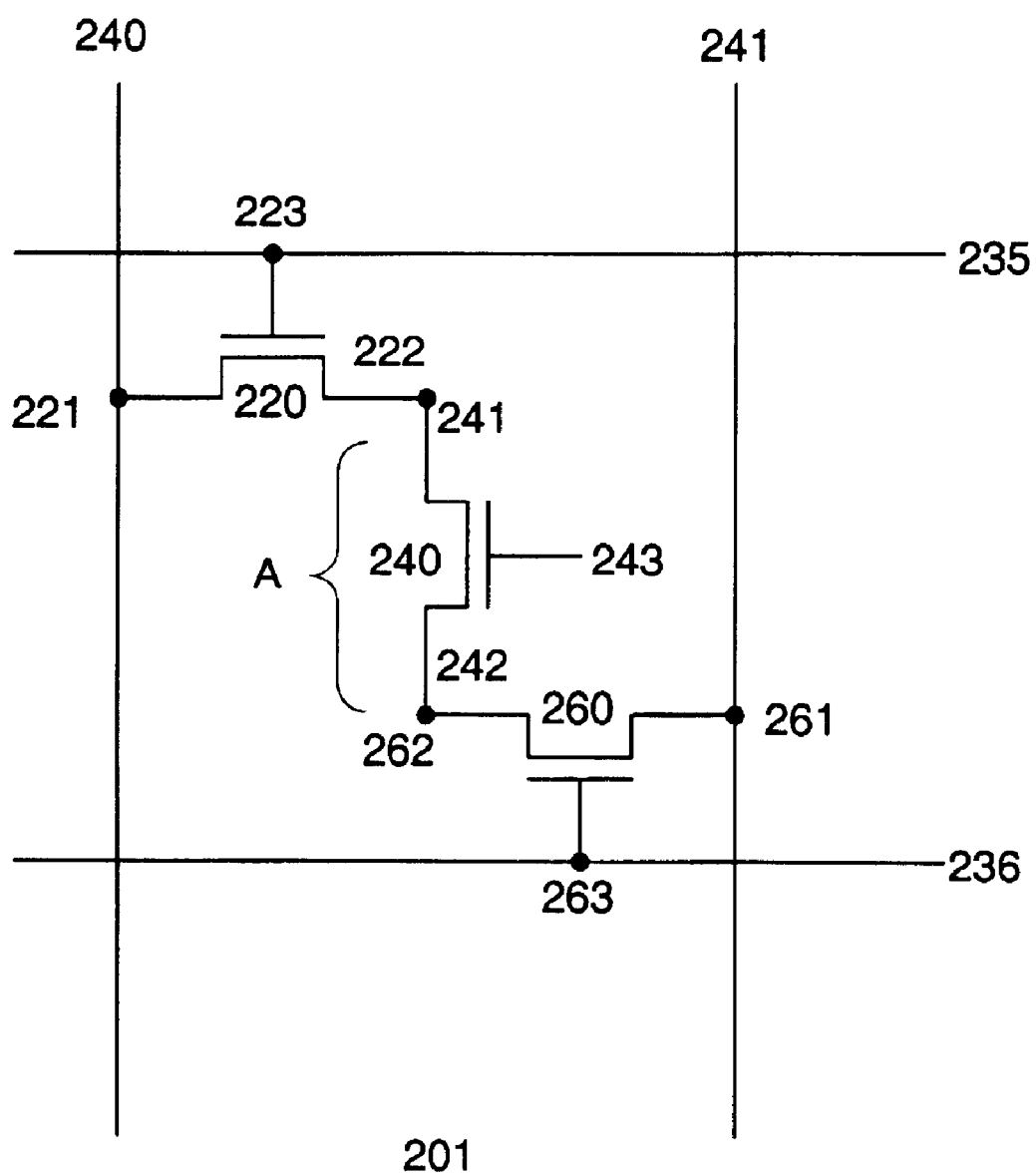
FIG. 2 shows a memory cell in accordance with one embodiment of the invention.

FIG. 2 shows a memory cell 201 in accordance with one embodiment of the invention. Such memory cell, for example, is described in parent patent applications, titled: "Dual-Port Memory Cell", U.S. Ser. No. 09/806,299 (attorney docket number: 98P 02816US); "Single-Port Memory Cell", U.S. Ser. No. 09/806,395 (attorney docket number: 98P 02842US) and "Layout for a SemiConductor Memory Cell", U.S. Ser. No. 09/615,987 (attorney docket number: 98P 02864US) which are herein incorporated by reference for all purposes. The memory cell comprises first and second access transistors 220 and 260 coupled in series to a storage transistor 240- The transistors, in one embodiment, are n-FETs. The memory cell can also be implemented with p-FETs or a combination of n and p-Fets.

The access transistors can serve as memory access ports, each coupled to a bit line (240 or 241) and a word line (235 or 236). In one embodiment, the first access transistor's first terminal 221 is coupled to the bit line 240 and its gate is coupled to the word line 235. Similarly, the second access transistor's first terminal 261 is coupled to bit line 241 and its gate is coupled to word line 236. The memory cell can be accessed either through the first or second port. Refreshing of the memory cell can also be performed through the access ports.

Second terminals 222 and 262 of the access transistors are respectively coupled to first and second terminals 241 and 242 of the storage transistor. A gate 243 of the storage transistor is coupled to an active signal to render the transistor conductive. In one embodiment, the storage transistor comprises an n-FET having its gate coupled to $V_{DD}$. As such, when power is applied to the IC, the storage transistor is rendered conductive, coupling the first and second terminals together to form node A. When power is removed from the IC, the first and second terminals are isolated from each other.

A memory access from the first port is performed by activating the word line 235 (e.g., logic 1) to render the first access transistor conductive. As a result, node A is coupled to the bit line via the first access transistor's first terminal 221. The charge stored at node A is transferred to the bit line for a read access or the charge on the bit line is transferred to node A for a write access by write circuitry (not shown). Accessing the second port of the memory cell is achieved by selecting the word line 236 to couple node A to the bit line 241. A refresh can be performed in the first or second port by activating the first or second word line.

In another embodiment, the first port of the memory cell serves as an access port and the second port of the memory cell serves as a dedicated refresh port from which refreshes are performed The first port is coupled to a bit line and a word line while the refresh port is coupled to a refresh bit line and a refresh word line. The operation of such a memory cell is described in concurrently filed patent application, titled "Memory Architecture with Refresh and Sense Amplifiers", U.S. Ser. No. 09/855,147 (attorney docket number: 00E 16984SG) which is herein incorporated by reference for all purposes.

Figure 3:
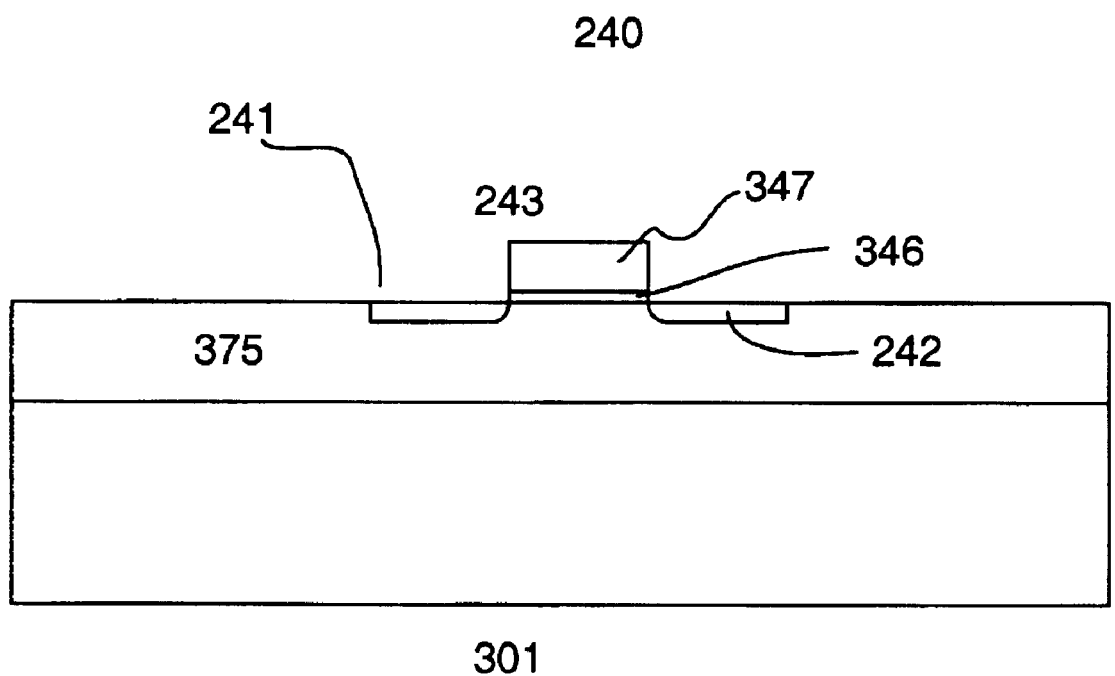
FIG. 3 shows a cross section of a storage transistor in accordance one embodiment of the invention.
Figure 4:
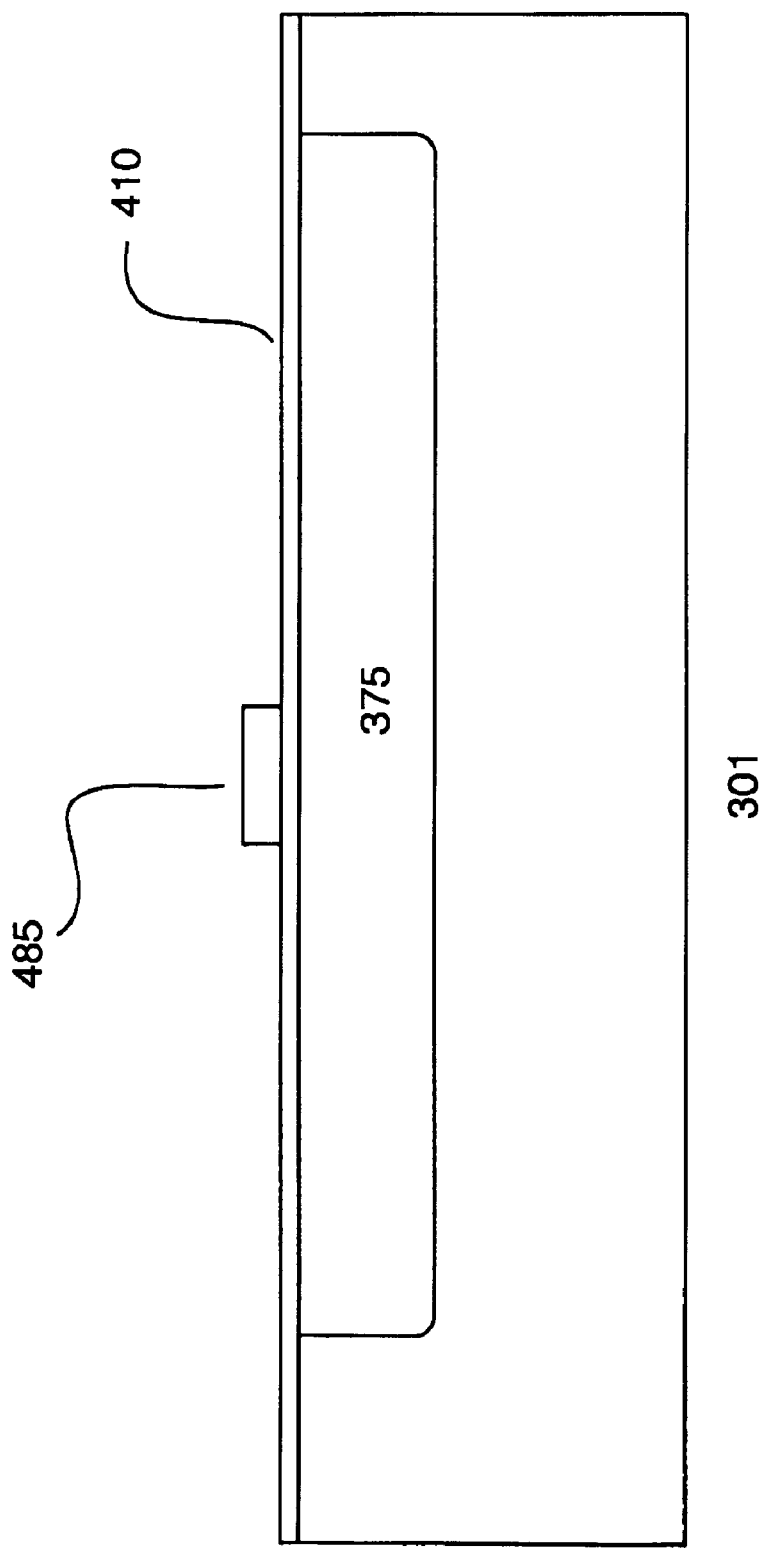
FIGS. 4–7 show a process for forming a memory cell in accordance with one embodiment of the invention.

FIG. 3 shows a cross section of a storage transistor 240 in accordance with one embodiment of the invention. The storage transistor is formed on a substrate 301. Typically, the substrate is a lightly doped p-type substrate. The substrate may include a heavily doped region 375 or well comprising dopants of a first conductivity type on which the transistor is formed. In one embodiment, the doped well is a p-well comprising p-type dopants such as boron (B). An n-FET is formed on the p-well. In the case of a p-FET, an n-well is provided.

The storage transistor comprises a gate 243 and first and second diffusion regions 241 and 242. The diffusion regions comprise dopants of a second conductivity type. In one embodiment, the diffusion regions comprise n-type dopants, such as phosphorus (P) and/or arsenic (As). The diffusion regions serve as first and second terminals of the transistor.

The gate comprises various layers, such as gate oxide 346 and a doped poly layer 347. Additional layers can also be included in the gate, for example, metal silicide and dielectric cap layer. In accordance with the invention, the gate dielectric comprises a high k dielectric material. High k dielectric is defined to include any dielectric material having a dielectric constant (k) which is greater than silicon dioxide. In one embodiment, the high k dielectric material comprises silicon nitride. Other types of high k materials such as SBT or PZT are also useful. The use of a high k dielectric material increases the capacitance of the transistor. This in turns increases the charge stored in the transistor, thus improving retention time.

In one embodiment of the invention, the gate oxide of the access transistors comprises silicon oxide or a material having a lower k than the high k material. The use of a high k material is undesirable for the access transistors since the increased capacitance adversely impacts their switching speed.

The cell can comprise a layout as describe in, for example, parent patent application "Layout for a SemiConductor Memory Cell", U.S. Ser. No. 09/615,987 (attorney docket number: 98P 02864US), which is herein incorporated by reference for all purposes.

Figure 5:
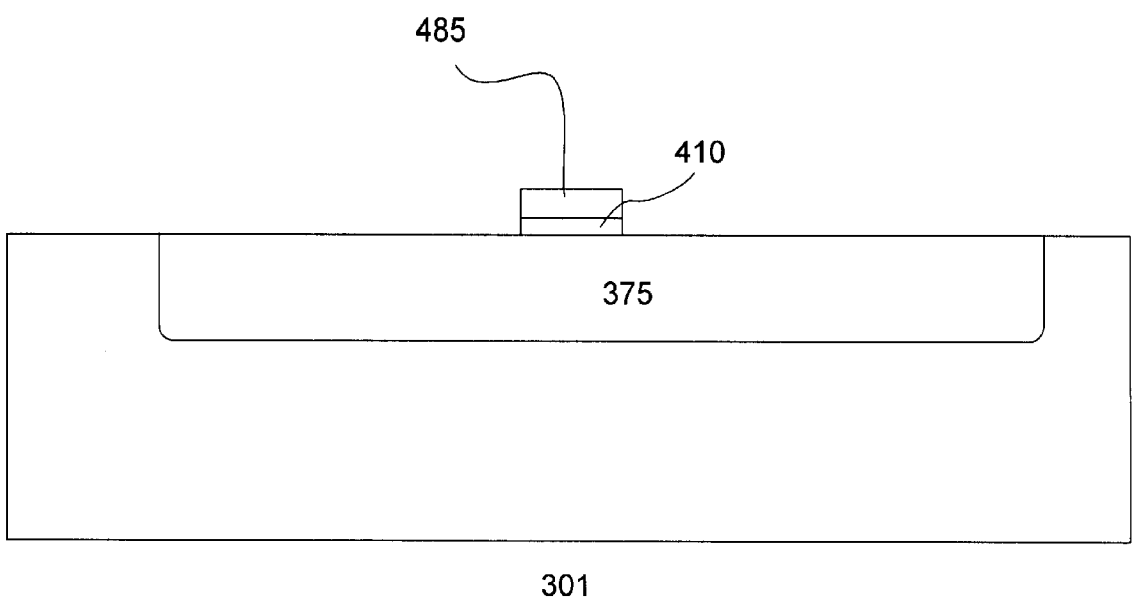

FIGS. 4–7 show a method for fabricating the memory cell in accordance with one embodiment of the invention. As shown, a semiconductor substrate 301 is provided. The substrate, for example, comprises silicon. Other types of semiconductor substrates are also useful. Typically, the substrate is lightly doped with p-type dopants. An implant is performed with p-type dopants to form a heavily doped p-well 375. A high k dielectric layer 410 layer is formed on the substrate. In one embodiment, the high k dielectric layer comprises silicon nitride formed by, for example, chemical vapor deposition. Other types of high k dielectric layers are also useful. A mask layer is deposited and patterned, leaving a portion 485 remaining to cover the high k dielectric layer where the gate of the storage transistor is to be formed. Subsequently, as shown in FIG. 5, the portions of the high k dielectric layer unprotected by the mask layer is removed to expose the substrate surface below. In one embodiment, a anisotropic etch such as a reactive ion etch (RIE) is used to removed portions of the high k dielectric layer. Other types of etches are also useful.

Figure 6:
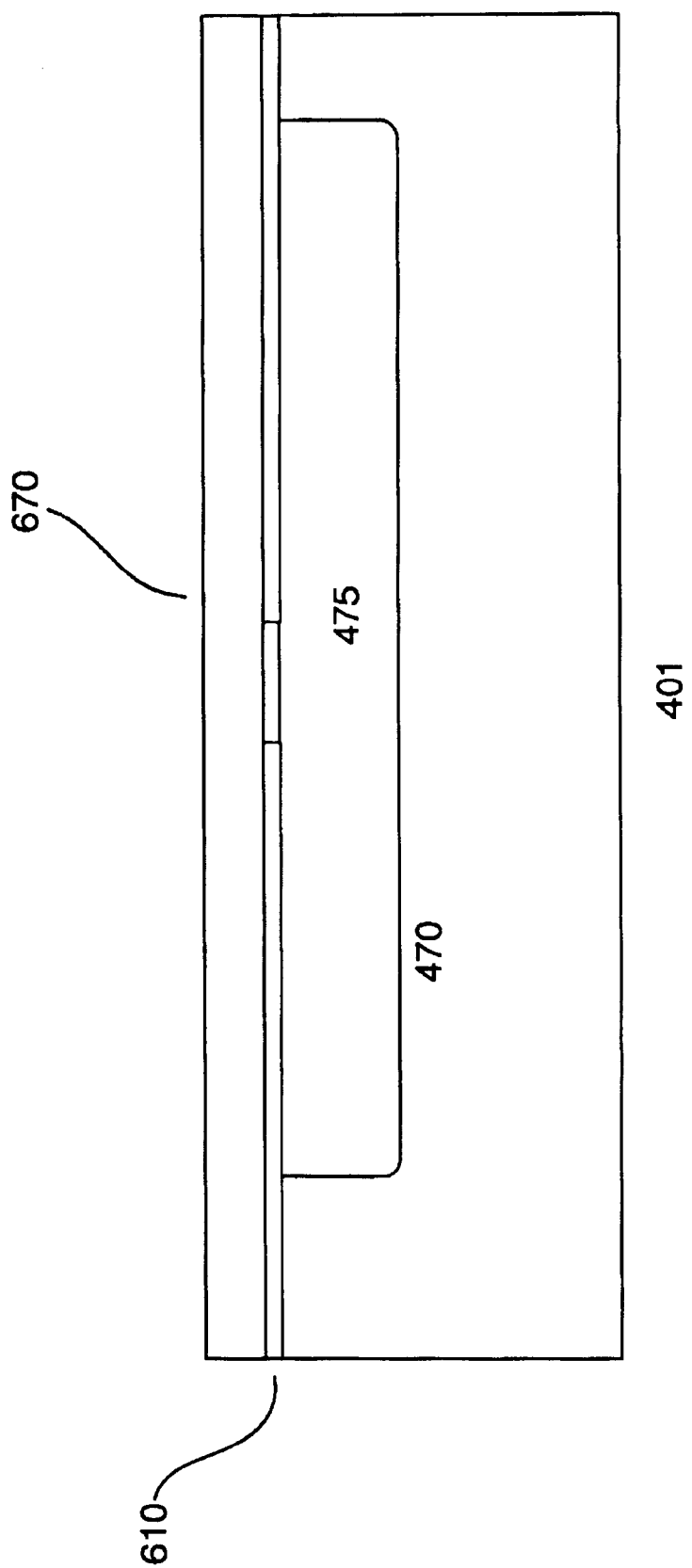

Referring to FIG. 6, a gate oxide layer 610 is formed on the exposed portions of the substrate. In one embodiment, the gate oxide layer comprises silicon oxide formed by, for example, thermal oxidation. Other techniques for forming the gate oxide are also useful. After the gate oxide is formed, the remaining portion of the mask layer is removed. A poly layer 670 is formed over the gate oxide and high k dielectric layers. The poly layer, for example, comprises a doped poly layer. Additional layers, such as a metal silicide and a nitride cap, can also be provided.

Figure 7:
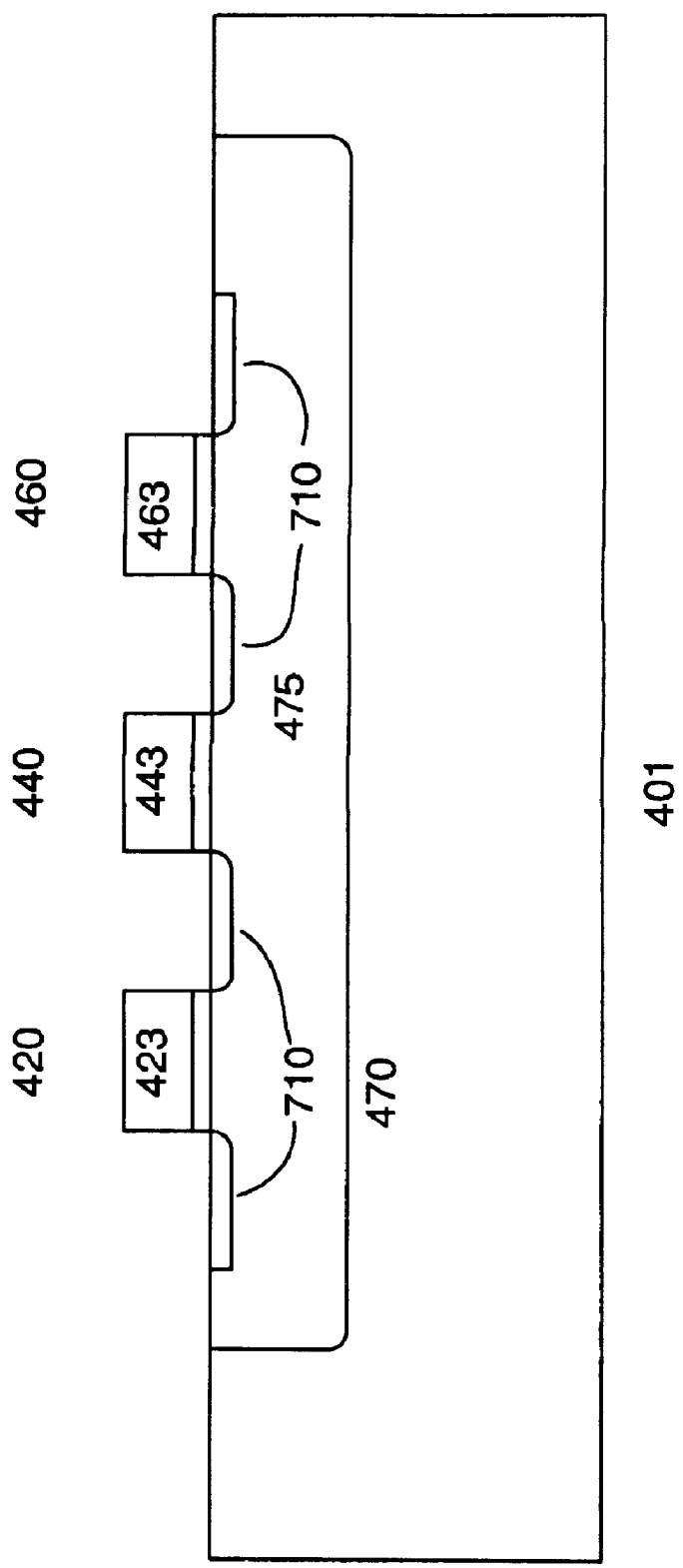

Referring to FIG. 7, the gate layers are then selectively etched to form gates 423, 443, and 463. The gates correspond the first, second, and third transistors 420, 440, and 460 of the memory cell. Doped regions 710 are then formed by, for example, ion implantation. Other techniques, such as diffusion, are also useful to form the doped regions. Illustratively, transistor 440 shares its doped regions with the first and third transistors. The first and third transistors serve as access transistors while the second transistor serve as the storage transistor. Additional processing is then performed to complete the memory cell. Such additional processing includes, for example, forming interlevel dielectric layers, contacts, bit lines, word lines, and final passivation.

In an alternative embodiment of the invention, the fabrication of the memory cell is simplified by providing all transistors with a high k dielectric gate oxide. Since the width of the port access transistors are relatively narrow, their performance can still be acceptable. If necessary, the width of the access transistors can be designed to take into account of the high k dielectric gate oxide.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising:
   first and second access transistors, each with a gate and first and second terminals;
   first and second bit lines, the first bit line coupled to the first terminal of the first access transistor and the second bit line coupled to a first terminal of the second transistor;
   first and second word lines, the first word line coupled to the first access transistor and the second word line coupled to the second access transistor;
   a storage transistor having a gate and first and second terminals, the first and second terminals respectively coupled to the second terminals of the first and second access transistors; and
   a gate oxide of the storage transistor comprises a dielectric material having a high dielectric constant to increase the capacitance of the storage transistor.

2. The memory cell according to claim 1 wherein the high dielectric constant is greater than silicon dioxide.

3. The memory cell according to claim 2 wherein the gate oxide of the storage transistor comprises SBT.

4. The memory cell according to claim 2 wherein the gate oxide of the storage transistor comprises PZT.

5. The memory cell according to claim 1 wherein a gate oxide of the first and second access transistors comprises a material having a dielectric constant that is lower than the high dielectric constant of the storage transistor.

6. The memory cell according to claim 5 wherein the gate oxide of the first and second access transistors comprises silicon oxide.

7. A memory cell comprising:
   first and second access transistors, each with a gate and first and second terminals;
   first and second bit lines, the first bit line coupled to the first terminal of the first access transistor and the second bit line coupled to the first terminal of the second access transistor;

first and second word lines, the first word line coupled to the first access transistor and the second word line coupled to the second access transistor;

a storage transistor having a gate and first and second terminals, the first and second terminals respectively coupled to the second terminals of the first and second access transistors, a gate oxide of the storage transistor comprises a dielectric material having a high dielectric constant to increase the capacitance of the storage transistor, the high dielectric constant being greater than silicon dioxide; and a gate oxide of the first and second access transistors comprises a dielectric material having a dielectric constant lower tan the high dielectric constant of the storage transistor.

8. The memory cell according to claim 7 wherein the gate oxide of the first and second access transistors comprises silicon oxide.

9. The memory cell according to claim 8 wherein the gate oxide of the storage transistor comprises SBT.

10. The memory cell according to claim 8 wherein the gate oxide of the storage transistor comprises PZT.

11. The memory cell according to claim 7 wherein the gate oxide of the storage transistor comprises SBT.

12. The memory cell according to claim 7 wherein the gate oxide of the storage transistor comprises PZT.

* * * * *